(12) United States Patent
Gao

(10) Patent No.: US 12,328,942 B2
(45) Date of Patent: Jun. 10, 2025

(54) SPECIAL-SHAPED THIN-FILM TRANSISTOR AND ARRAY SUBSTRATE

(71) Applicant: SHENZHEN CHINA STAR OPTOELECTRONICS SEMICONDUCTOR DISPLAY TECHNOLOGY CO., LTD., Guangdong (CN)

(72) Inventor: Rui Gao, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/758,208

(22) PCT Filed: May 20, 2022

(86) PCT No.: PCT/CN2022/094039
§ 371 (c)(1),
(2) Date: Jun. 29, 2022

(87) PCT Pub. No.: WO2023/216298
PCT Pub. Date: Nov. 16, 2023

(65) Prior Publication Data
US 2024/0186328 A1 Jun. 6, 2024

(30) Foreign Application Priority Data
May 11, 2022 (CN) .......................... 202210512981.2

(51) Int. Cl.
G02F 1/1362 (2006.01)
G02F 1/1368 (2006.01)
(Continued)

(52) U.S. Cl.
CPC ....... H10D 86/60 (2025.01); G02F 1/136286 (2013.01); G02F 1/1368 (2013.01); H10D 30/6729 (2025.01); H10D 86/441 (2025.01)

(58) Field of Classification Search
CPC ............. H01L 27/124; H01L 29/41733; G02F 1/136286; G02F 1/1368; H10D 86/60; H10D 30/6729; H10D 86/441
See application file for complete search history.

(56) References Cited

U.S. PATENT DOCUMENTS

2008/0111934 A1 5/2008 Wu et al.
2014/0339554 A1 11/2014 Xi et al.

FOREIGN PATENT DOCUMENTS

CN 101030583 A 9/2007
CN 102054832 A 5/2011
(Continued)

OTHER PUBLICATIONS

CN 102790093 A machine translation (Year: 2012).*
(Continued)

Primary Examiner — James A Dudek
(74) Attorney, Agent, or Firm — PV IP PC; Wei Te Chung

(57) ABSTRACT

A special-shaped thin-film transistor and an array substrate are provided. The special-shaped thin-film transistor includes a first gate portion, a first compensation electrode, and a first source electrode. The first compensation electrode is connected to the first gate portion. The first source electrode includes a first extension part, a first source portion, and a second extension part which are connected in sequence. Part of the first extension part overlaps the first gate portion, and part of the second extension part overlaps the first compensation electrode.

16 Claims, 9 Drawing Sheets

(51) Int. Cl.
*H10D 30/67* (2025.01)
*H10D 86/40* (2025.01)
*H10D 86/60* (2025.01)

(56) References Cited

FOREIGN PATENT DOCUMENTS

| | | |
|---|---|---|
| CN | 102790093 A | 11/2012 |
| CN | 103904130 A | 7/2014 |

OTHER PUBLICATIONS

International Search Report in International application No. PCT/CN2022/094039, mailed on Nov. 25, 2022.
Written Opinion of the International Search Authority in International application No. PCT/CN2022/094039, mailed on Nov. 25, 2022.
Chinese Office Action issued in corresponding Chinese Patent Application No. 202210512981.2 dated Apr. 19, 2023, pp. 1-6.

\* cited by examiner

SPECIAL-SHAPED THIN-FILM TRANSISTOR AND ARRAY SUBSTRATE

BACKGROUND OF INVENTION

1. Field of Invention

The present application relates to a technical field of displays, and particularly to a special-shaped thin-film transistor and an array substrate.

2. Related Art

Liquid crystal displays are currently the most widely used displays. Compared with traditional cathode ray tube (CRT) displays, liquid crystal displays have advantages of being thin, low power consumption, and low voltage driving, etc. Display areas of liquid crystal displays include multiple pixel areas. Each of the pixel areas is an area defined by two gate lines and two data lines, in which thin-film transistors serving as switching elements and pixel electrodes are arranged.

As shown in FIG. 1, an array substrate of a liquid crystal display panel is provided with a thin-film transistor. The thin-film transistor includes a gate electrode 1, an active layer 2, a drain electrode 3, and a source electrode 4. The active layer 2 is arranged above the gate electrode 1, and the drain electrode 3 and the source electrode 4 are arranged above the active layer 2. In addition, the drain electrode 3 and the source electrode 4 are connected to the active layer 2, respectively, wherein an overlapping area of the source electrode 4 and the gate electrode 1 will generate parasitic capacitance, and the parasitic capacitance is same as that of the active layer 2. A relationship of a feed voltage is as follows:

$$\Delta V = \frac{C_{gs}}{C_{gs} + C_{lc} + C_{st}} \times (V_{gh} - V_{gl})$$

$\Delta V$ is an input voltage, Cgs is a parasitic capacitance generated by the source electrode 4 and the gate electrode 1, Clc is a capacitance on both sides of a liquid crystal layer of the liquid crystal display panel, Cst is a storage capacitor, Vgh is a turn-on voltage of the thin-film transistor, and Vgl is a turn-off voltage of the thin-film transistor.

It can be known from the above formula that the parasitic capacitance will affect size of the input voltage. In a process of fabricating the array substrate, due to process variation, the source electrode 4 will be shifted left and right. As shown in FIG. 1, when the source electrode 4 is shifted to the left, an overlapping area of the source electrode 4 and the gate electrode 1 will increase. At this time, the parasitic capacitance will also increase. According to the above formula, the feeding voltage will also increase. At this time, an AC voltage will appear on the liquid crystal display panel, which is likely to cause a problem of screen flickers and afterimages.

Therefore, it is imperative to provide a technical solution to solve the above-mentioned problem.

SUMMARY OF INVENTION

Embodiments of the present application provide a special-shaped thin-film transistor and an array substrate, which can solve the technical problem of parasitic capacitance changes of the array substrate due to process variation.

An embodiment of the present application provides a special-shaped thin-film transistor, including a first gate portion; a first compensation electrode located on one side of the first gate portion and connected to the first gate portion; and a first source electrode disposed in a layer different from the first gate portion and the first compensation electrode, and the first source electrode comprising a first extension part, a first source portion, and a second extension part, wherein the first extension part is connected to the first source portion, the second extension part is connected to the first source portion, part of the first extension part overlaps the first gate portion, and part of the second extension part overlaps the first compensation electrode.

Under this structure, when the first source electrode is shifted left and right due to process variation, a total area of both the first gate portion and the first compensation electrode overlapping the first source electrode may always remain unchanged, so that a technical problem of parasitic capacitance changes caused by process variation is solved.

Optionally, in some embodiments of the present application, an extending direction of the first extension part and an extending direction of the second extension part are parallel, and the extending direction of the first extension part is opposite to the extending direction of the second extension part.

Under this structure, the first source electrode is easy to be fabricated due to its simple shape, and the process difficulty of the special-shaped thin-film transistor will not be increased.

Optionally, in some embodiments of the present application, in a direction perpendicular to the extending direction of the first extension part or the second extension part, a width of the first extension part is same as a width of the second extension part.

Under this structure, even if the first source electrode is shifted left and right due to process variation, it can be ensured that a change value of the overlapping area of the first extension part and the first gate portion is equal to a change value of the overlapping area of the second extension part and the first gate portion, so that the parasitic capacitance of the special-shaped thin-film transistor remains unchanged.

Optionally, in some embodiments of the present application, in the extending direction of the first extension part or the second extension part, the first extension part and the second extension part are at least partially overlapping or staggered.

Under this structure, when the first extension part in a first direction and the second extension part in the first direction are at least partially overlapping, space taken up by the first source electrode can be reduced, which is beneficial to achieve the miniaturization of the special-shaped thin-film transistor. When the first extension part and the second extension part are staggered from each other in the first direction, the first source electrode can be increased in size, thereby reducing contact resistance of the first source electrode, reducing energy loss, and improving the performance of the special-shaped thin-film transistor.

Optionally, in some embodiments of the present application, the special-shaped thin-film transistor further includes a second compensation electrode disposed in a layer different from the first source electrode and connected to the first gate portion, and a third compensation electrode disposed in a layer different from the first source electrode and connected to the first gate portion. The third compensation electrode is arranged on a side of the second compensation electrode in a direction perpendicular to the extending direction of the first extension part or the second extension part, and the first source portion is arranged between the second compensation electrode and the third compensation electrode;

The first source electrode further includes a third extension part and a fourth extension part, the third extension part is connected to the first source portion, part of the third extension part overlaps the second compensation electrode, the fourth extension part is connected to the first source portion, and part of the fourth extension part overlaps the third compensation electrode.

Under this structure, when the first source electrode is shifted up and down due to the process variation, a total area of the first gate portion and the first compensation electrode overlapping with the first source electrode can always remain unchanged, and a total area of the second compensation electrode and the third compensation electrode overlapping with the first source electrode can always remain unchanged, thus solving the technical problem of parasitic capacitance changes of the array substrate due to process variation.

Optionally, in some embodiments of the present application, an extending direction of the third extension part and an extending direction of the fourth extension part are parallel, the extending direction of the third extension part is opposite to the extending direction of the fourth extension part, and the extending direction of the third extension part intersects with the extending direction of the first extension part.

Under this structure, the first source electrode is easy to be fabricated due to its simple shape, and the process difficulty of the special-shaped thin-film transistor will not be increased.

Optionally, in some embodiments of the present application, in a direction perpendicular to the extending direction of the third extension part or the fourth extension part, a width of the third extension part is same as a width of the fourth extension part.

Under this structure, even if the first source electrode is shifted up and down due to the process variation, it can be ensured that a change value of the overlapping area of the third extension part and the second compensation electrode is equal to a change value of the overlapping area of the fourth extension part and the third compensation electrode, so that the parasitic capacitance of the special-shaped thin-film transistor remains unchanged.

Optionally, in some embodiments of the present application, in the extending direction of the third extension part or the fourth extension part, the third extension part and the fourth extension part are at least partially overlapping or staggered.

Under this structure, when the third extension part in the first direction and the fourth extension part in the first direction are at least partially overlapping, space taken up by the first source electrode can be reduced, which is beneficial to achieve the miniaturization of the special-shaped thin-film transistor. When the third extension part and the fourth extension part are staggered from each other in the first direction, the first source electrode can be increased in size, thereby reducing contact resistance of the first source electrode, reducing energy loss, and improving the performance of the special-shaped thin-film transistor.

Optionally, in some embodiments of the present application, the first extension part is disposed between the first compensation electrode and a side of the first gate portion away from the first compensation electrode, and the second extension part is disposed between the first gate portion and a side of the first compensation electrode away from the first gate portion.

Under this structure, it can be ensured that a total area of the first gate portion and the first compensation electrode overlapping with the first source electrode can always remain unchanged.

Embodiments of the present application further provide an array substrate, the array substrate including the above-mentioned special-shaped thin-film transistor. The array substrate further includes a gate line and a data line. The first gate portion and the first compensation electrode are arranged on a same side of the gate line, the first compensation electrode is arranged on a side of the first gate portion in an extending direction of the gate line, the first compensation electrode is connected to the first gate portion through the gate line, and the data line is connected to the first source electrode.

Under this structure, when the first source electrode is shifted left and right due to process variation, a total area of both the first gate portion and the first compensation electrode overlapping the first source electrode may always remain unchanged, so that a technical problem of parasitic capacitance changes caused by process variation is solved.

Optionally, in some embodiments of the present application, an extending direction of the first extension part and an extending direction of the second extension part are parallel, and the extending direction of the first extension part is opposite to the extending direction of the second extension part.

Under this structure, the first source electrode is easy to be fabricated due to its simple shape, and the process difficulty of the special-shaped thin-film transistor will not be increased.

Optionally, in some embodiments of the present application, in a direction perpendicular to the extending direction of the first extension part or the second extension part, a width of the first extension part is same as a width of the second extension part.

Under this structure, even if the first source electrode is shifted left and right due to process variation, it can be ensured that a change value of the overlapping area of the first extension part and the first gate portion is equal to a change value of the overlapping area of the second extension part and the first gate portion, so that the parasitic capacitance of the special-shaped thin-film transistor remains unchanged.

Optionally, in some embodiments of the present application, in the extending direction of the first extension part or the second extension part, the first extension part and the second extension part are at least partially overlapping or staggered.

Under this structure, when the first extension part in the first direction and the second extension part in the first direction are at least partially overlapping, space taken up by the first source electrode can be reduced, which is beneficial to achieve the miniaturization of the special-shaped thin-film transistor. When the first extension part and the second extension part are staggered from each other in the first direction, the first source electrode can be increased in size, thereby reducing contact resistance of the first source electrode, reducing energy loss, and improving the performance of the special-shaped thin-film transistor.

Optionally, in some embodiments of the present application, the special-shaped thin-film transistor further includes a second compensation electrode disposed in a layer different from the first source electrode and connected to the first gate portion, and a third compensation electrode disposed in a layer different from the first source electrode and connected to the first gate portion, wherein the third compensation electrode is arranged on a side of the second compensation electrode in a direction perpendicular to the extending direction of the first extension part or the second extension part, and the first source portion is arranged between the second compensation electrode and the third compensation electrode.

The first source electrode further includes a third extension part and a fourth extension part, the third extension part is connected to the first source portion, part of the third extension part overlaps the second compensation electrode, the fourth extension part is connected to the first source portion, and part of the fourth extension part overlaps the third compensation electrode.

Under this structure, when the first source electrode is shifted up and down due to the process variation, a total area of the first gate portion and the first compensation electrode overlapping with the first source electrode can always remain unchanged, and a total area of the second compensation electrode and the third compensation electrode overlapping with the first source electrode can always remain unchanged, thus solving the technical problem of parasitic capacitance changes of the array substrate due to process variation.

Optionally, in some embodiments of the present application, an extending direction of the third extension part and an extending direction of the fourth extension part are parallel, the extending direction of the third extension part is opposite to the extending direction of the fourth extension part, and the extending direction of the third extension part intersects with the extending direction of the first extension part.

Under this structure, the first source electrode is easy to be fabricated due to its simple shape, and the process difficulty of the special-shaped thin-film transistor will not be increased.

Optionally, in some embodiments of the present application, in a direction perpendicular to the extending direction of the third extension part or the fourth extension part, a width of the third extension part is same as a width of the fourth extension part.

Under this structure, even if the first source electrode is shifted up and down due to the process variation, it can be ensured that a change value of the overlapping area of the third extension part and the second compensation electrode is equal to a change value of the overlapping area of the fourth extension part and the third compensation electrode, so that the parasitic capacitance of the special-shaped thin-film transistor remains unchanged.

Optionally, in some embodiments of the present application, in the extending direction of the third extension part or the fourth extension part, the third extension part and the fourth extension part are at least partially overlapping or staggered.

Under this structure, when the third extension part in the first direction and the fourth extension part in the first direction are at least partially overlapping, space taken up by the first source electrode can be reduced, which is beneficial to achieve the miniaturization of the special-shaped thin-film transistor. When the third extension part and the fourth extension part are staggered from each other in the first direction, the first source electrode can be increased in size, thereby reducing contact resistance of the first source electrode, reducing energy loss, and improving the performance of the special-shaped thin-film transistor.

Optionally, in some embodiments of the present application, the first extension part is disposed between the first compensation electrode and a side of the first gate portion away from the first compensation electrode, and the second extension part is disposed between the first gate portion and a side of the first compensation electrode away from the first gate portion.

Under this structure, it can be ensured that a total area of the first gate portion and the first compensation electrode overlapping with the first source electrode can always remain unchanged.

Optionally, in some embodiments of the present application, the array substrate further includes a subpixel region including a first region and a second region, and a first pixel electrode and a second pixel electrode, wherein the first pixel electrode is arranged corresponding to the first region, and the second pixel electrode is arranged corresponding to the second region.

The array substrate includes two special-shaped thin-film transistors including a first special-shaped thin-film transistor and a second special-shaped thin-film transistor, a first source of the first special-shaped thin-film transistor and a second source of the second special-shaped thin-film transistors are electrically connected to the first pixel electrode and the second pixel electrode, respectively.

Under this structure, a voltage for driving the first pixel electrode is independently controlled by the special-shaped thin-film transistor, and the second pixel electrode is independently controlled and driven by the sub-thin film transistor. In this manner, the voltages of the first pixel electrode and the second pixel electrode are different, which is beneficial to achieve multi-domain display.

Optionally, in some embodiments of the present application, a first gate portion of the first special-shaped thin-film transistor is connected to the gate line through a first gate portion of the second special-shaped thin-film transistor, and an extending direction of a first extension part included in the first special-shaped thin-film transistor intersects with an extending direction of a first extension part included in the second special-shaped thin-film transistor.

Under this structure, space of the array substrate can be allocated reasonably, and the first special-shaped thin-film transistor and the second special-shaped thin-film transistor are constructed compactly, which is beneficial to improve an aperture ratio.

The present application has advantageous effects as follows: a special-shaped thin-film transistor and an array substrate are provided in embodiments of the present application. By disposing a first compensation electrode on one side of a first gate portion, the first compensation electrode is connected to the first gate portion, and a first source portion is disposed between the first gate portion and the first compensation electrode. The first source portion extends toward the first gate portion to form a first extension part, and the first extension part is arranged to partially overlap the first gate portion. The source portion further extends toward the first compensation electrode to form a second extension part, and part of the second extension part overlaps the first compensation electrode. When the first source electrode is shifted left and right due to process variation, a total area of both the first gate portion and the first compensation electrode overlapping the first source electrode may always remain unchanged, so that a technical problem of parasitic capacitance changes caused by process variation is solved.

BRIEF DESCRIPTION OF DRAWINGS

In order to better illustrate the technical solutions in the embodiments of the present application, the following will briefly introduce the accompanying drawings that need to be used in the description of the embodiments. Apparently, the accompanying drawings in the following description show merely some embodiments of the present invention, and a person skilled in the art may still derive other drawings from these accompanying drawings without creative efforts.

DESCRIPTION OF PREFERRED EMBODIMENTS

The technical solutions in the embodiments of the present application will be clearly and completely described below with reference to the drawings in the embodiments of the present application. Obviously, the described embodiments are only a part of the embodiments of the present application rather than all the embodiments. Based on the embodiments in this application, all other embodiments obtained by those skilled in the art without creative work shall fall within the protection scope of this application. It should be understood that the specific embodiments described here are only used to illustrate the present application, and are not used to limit the present application. In this application, if no explanation is made to the contrary, the orientation words used, such as "upper" and "lower" usually refer to the upper and lower positions of the device in actual use or working state. Specifically, they refer to the direction of the drawings, and "inner" and "outer" refer to the outline of the device.

Embodiments of the present application provides a special-shaped thin-film transistor and an array substrate. Detailed descriptions are given below. It should be noted that the description order of the following embodiments is not intended to limit the preferred order of the embodiments.

Figure 1:
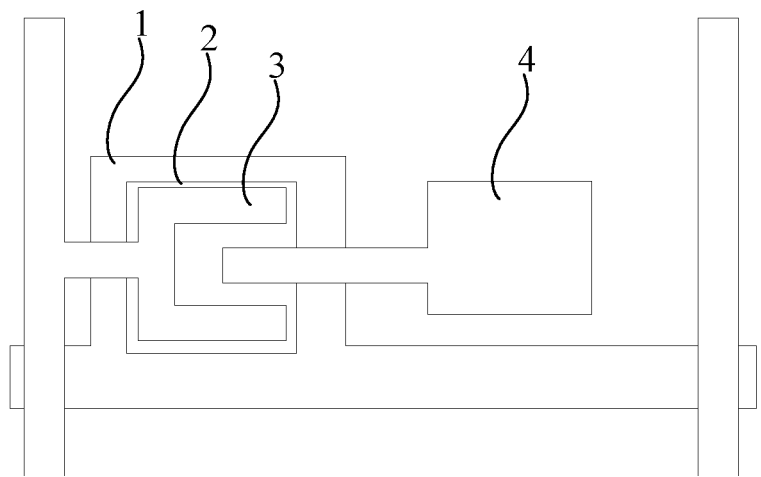
FIG. 1 is a schematic structural view of a conventional array substrate.
Figure 2:
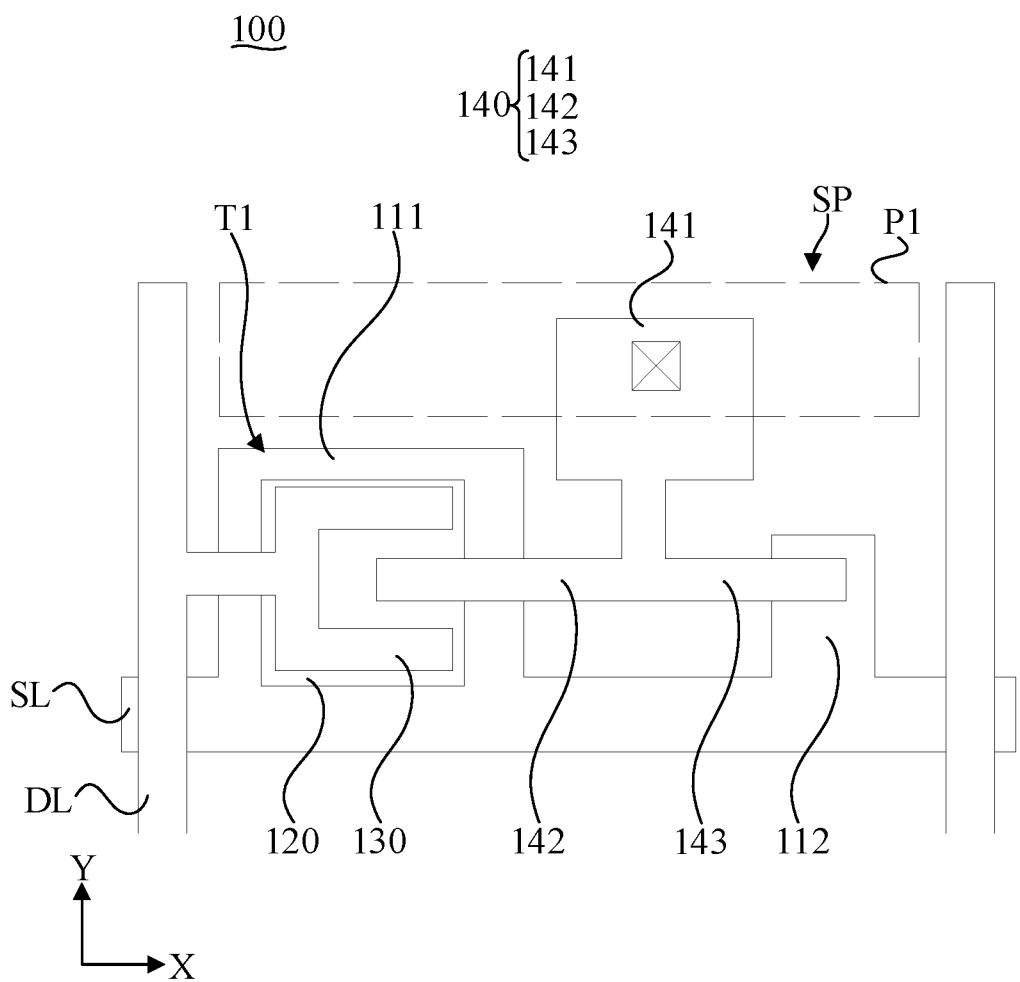
FIG. 2 is a schematic structural view of a first type of array substrate in an embodiment of the present application.

Referring to FIG. 2, an embodiment of the present application provides an array substrate 100 including a special-shaped thin-film transistor T1 including a first gate portion 111 and a first compensation electrode 112. The first compensation electrode 112 is located on a side of the first gate portion 111, and the first compensation electrode 112 is connected to the first gate portion 111, that is, the first compensation electrode 112 is electrically connected to the first gate portion 111.

In the embodiment of the present application, the first compensation electrode 112 and the first gate portion 111 are spaced apart from each other. There is a gap between the first compensation electrode 112 and the first gate portion 111, and the first compensation electrode 112 and the first gate portion 111 are located in a same layer structure. Certainly, according to actual selection and specific requirements, the first compensation electrode 112 and the first gate portion 111 may be located in different layers according to actual selection and specific requirements, as long as it is ensured that the first compensation electrode 112 is connected to the first gate portion 111, and the gap is formed between the first compensation electrode 112 and the first gate portion 111 in a direction parallel to the array substrate 100, which is not limited herein.

Specifically, the special-shaped thin-film transistor T1 further includes a first source electrode 140 disposed in a layer different from the first gate portion 111. The first source electrode 140 and the first compensation electrode 112 are disposed in different layers, that is, the first gate portion 111 and the first compensation electrode 112 are located in different layer structures from the first source electrode 140. Specifically, the first source electrode 140 includes a first extension part 142, a first source portion 141, and a second extension part 143. The first extension part 142 is connected to the first source portion 141, the second extension part 143 is connected to the first source portion 141, and the first source portion 141 is located between the first gate portion 111 and the first compensation electrode 112. Part of the first extension part 142 overlaps the first gate portion 111, and part of the second extension part 143 overlaps the first compensation electrode 112. In this embodiment, the first extension part 142 is disposed on a side of the first source portion 141 close to the first gate portion 111, and the second extension part 143 is disposed on a side of the first source portion 141 close to the first compensation electrode 112.

In the array substrate 100 of the embodiment of the present application, the first compensation electrode 112 is disposed on one side of the first gate portion 111 and is connected to the first gate portion 111, and the first source portion 141 is disposed between the first gate portion 111 and the first compensation electrode 112. The first source portion 141 extends toward the first gate portion 111 to form the first extension part 142, and the first extension part 142 is arranged to partially overlap the first gate portion 111. The source portion 141 further extends toward the first compensation electrode 112 to form the second extension part 143, and the part of the second extension part 143 overlaps the first compensation electrode 112. Under this structure, parasitic capacitance of the special-shaped thin-film transistor T1 is equal to capacitance between the first extension part 142 and the first gate portion 111 plus capacitance between the second extension part 143 and the first compensation electrode 112.

When the first source electrode 140 is shifted to the left due to a manufacturing process, an overlapping area of the first extension part 142 and the first gate portion 111 increases, and the capacitance between the first extension part 142 and the first gate portion 111 increases. Accordingly, an overlapping area of the second extension part 143 and the first compensation electrode 112 decreases, and the capacitance between the second extension part 143 and the first compensation electrode 112 is reduced, so that a capacitance change value between the first extension part 142 and the first extension part 111 is equal to a capacitance change value between the second extension part 143 and the first compensation electrode 112, making the parasitic capacitance of the special-shaped thin-film transistor T1 unchanged. Likewise, when the first source electrode 140 is shifted to the right due to the manufacturing process, the parasitic capacitance of the special-shaped thin-film transistor T1 also remains unchanged. Therefore, the technical solution of the present application can solve the technical problem of increased parasitic capacitance due to process deviation.

Specifically, the first extension part 142 is disposed between the first compensation electrode 112 and a side of the first gate portion 111 away from the first compensation electrode 112, and the second extension part 143 is disposed between the first gate portion 111 and a side of the first compensation electrode 112 away from the first gate portion 111. Preferably, in an extending direction of the first extension part 142, a gap is formed between the first extension part 142 and the side of the first gate portion 111 away from the first compensation electrode 112. In addition, a gap is formed between the second extension part 143 and the side of the compensation electrode 112 away from the first gate portion 111. Under this structure, it can be ensured that a total area of the first gate portion 111 and the first compensation electrode 112 overlapping with the first source electrode 140 can always remain unchanged.

Specifically, as shown in FIG. 2, the special-shaped thin-film transistor T1 further includes a first active layer 120 and a first drain electrode 130. The first active layer 120 and the first gate portion 111 are disposed in different layers, and the first active layer 120 and the first gate portion 111 are disposed at least partially overlapping. The first drain electrode 130 and the first gate portion 111 are disposed in different layers, the first drain electrode 130 is also disposed in a layer different from the first compensation electrode 112, and the first drain electrode 130 and the first source electrode 140 are connected to the first active layer 120, respectively.

In the embodiment of the present application, the first active layer 120 is disposed above the first gate portion 111, and the first source electrode 140 and the first drain electrode 130 are disposed in a same layer and above the first active layer 120. Certainly, according to actual selection and specific requirements, a stacking sequence of the first gate portion 111, the first active layer 120, the first source electrode 140, and the first drain electrode 130 can be appropriately modified, which is not limited here.

Specifically, as shown in FIG. 2, the array substrate 100 further includes a first pixel electrode P1 connected to the first source electrode 140. Specifically, the pixel electrode P1 may be connected to the first source portion 141 of the first source electrode 140 through a via hole, so as to transmit a voltage to the first pixel electrode P1.

Specifically, as shown in FIG. 2, the array substrate 100 further includes a gate line SL and a data line DL. The gate line SL and the first gate portion 111 are arranged in a same layer, and the data line DL and the first source electrode 140 are arranged in a same layer. The gate line The SL extends in a first direction X, the data line DL extends in a second direction Y, and the first direction X and the second direction Y intersect. In this embodiment of the present application, the first direction X and the second direction Y can be set vertically. Certainly, the first direction X and the second direction Y can be set at other angles according to actual situations and specific requirements, which is not limited here. In this embodiment, the first drain electrode 130 is connected to the data line DL, that is, the first drain electrode 130 is electrically connected to the data line DL.

Specifically, as shown in FIG. 2, the first gate portion 111 and the first compensation electrode 112 are arranged on a same side of the gate line SL, the first compensation electrode 112 is arranged on a side of the first gate portion 111 in the first direction X, and the first compensation electrode 112 is connected to the first gate portion 111 through the gate line SL. With this structure, space of the array substrate 100 can be allocated reasonably, which is beneficial to achieve miniaturization of the special-shaped thin-film transistor T1.

Specifically, the first extension part 142 and the second extension part 143 are both strip-line in shape, wherein the extension direction of the first extension part 142 and the extension direction of the second extension part 143 are both parallel to the first direction X, and the extending direction of the first extension part 142 is opposite to that of the second extension part 143. With this structure, the first source electrode 140 is easy to be fabricated due to its simple shape, so that process difficulty of the special-shaped thin-film transistor T1 will not be increased.

Specifically, in the second direction Y, a width of the first extension part 142 is equal to a width of the second extension part 143. Under this structure, even if the first source electrode 140 is shifted left and right due to process variation, it can be ensured that a change value of the overlapping area of the first extension part 142 and the first gate portion 111 is equal to a change value of the overlapping area of the second extension part 143 and the first gate portion 111, so that the parasitic capacitance of the special-shaped thin-film transistor T1 remains unchanged.

Specifically, as shown in FIG. 2, in the first direction X, the first extension part 142 and the second extension part 143 completely overlap, that is, the first extension part 142 is located on an extension line of the second extension part 143. With this structure, the occupied space of the first source electrode 140 can be reduced, which is beneficial to achieve the miniaturization of the special-shaped thin-film transistor T1. Certainly, according to actual selection and specific requirements, in the first direction X, the first extension part 142 and the second extension part 143 may also partially overlap, which is not limited herein.

Figure 3:
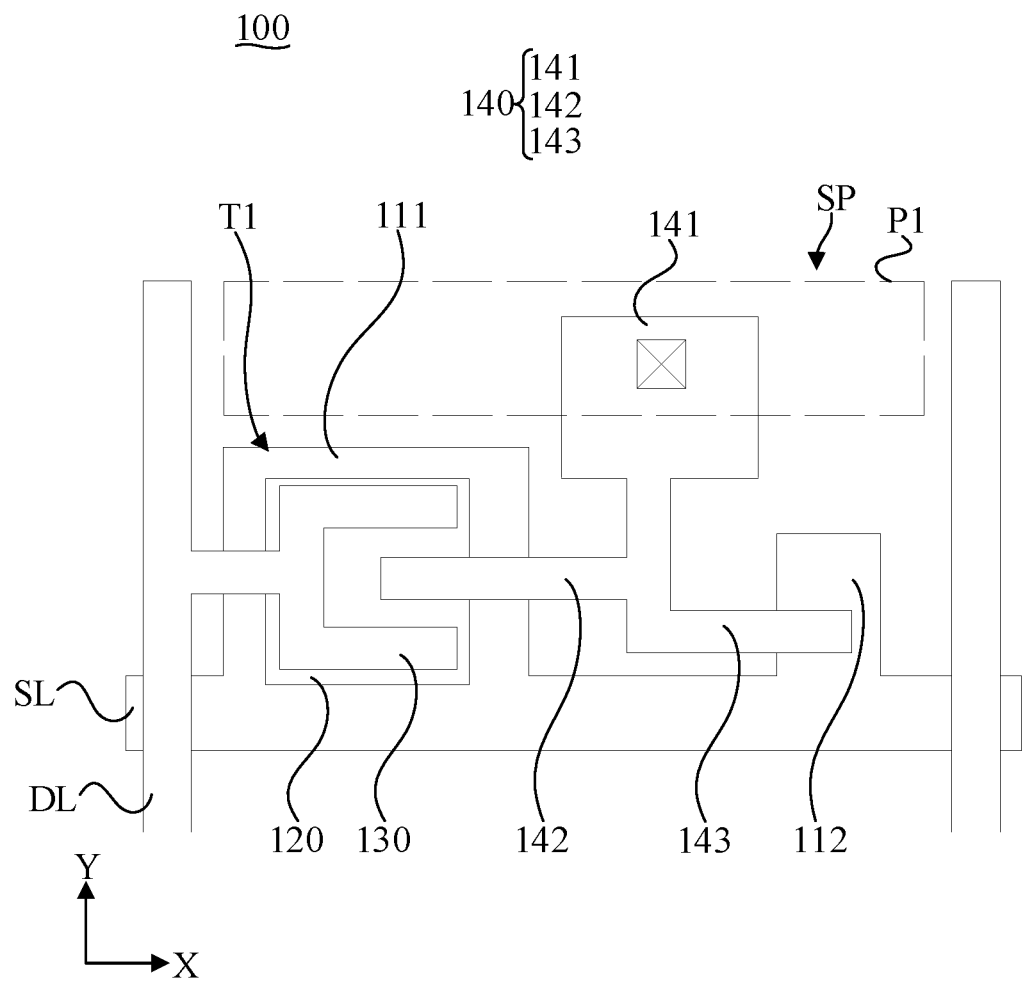
FIG. 3 is a schematic structural view of a second type of array substrate in an embodiment of the present application.

In another embodiment of the present application, as shown in FIG. 3, in the first direction X, the first extension part 142 and the second extension part 143 are staggered from each other, that is, the first extension part 142 is arranged to avoid the extension line of the second extension part 143. With this structure, the first source electrode 140 can be increased in size, thereby reducing contact resistance of the first source electrode 140, reducing energy loss, and improving the performance of the special-shaped thin-film transistor T1.

Figure 4:
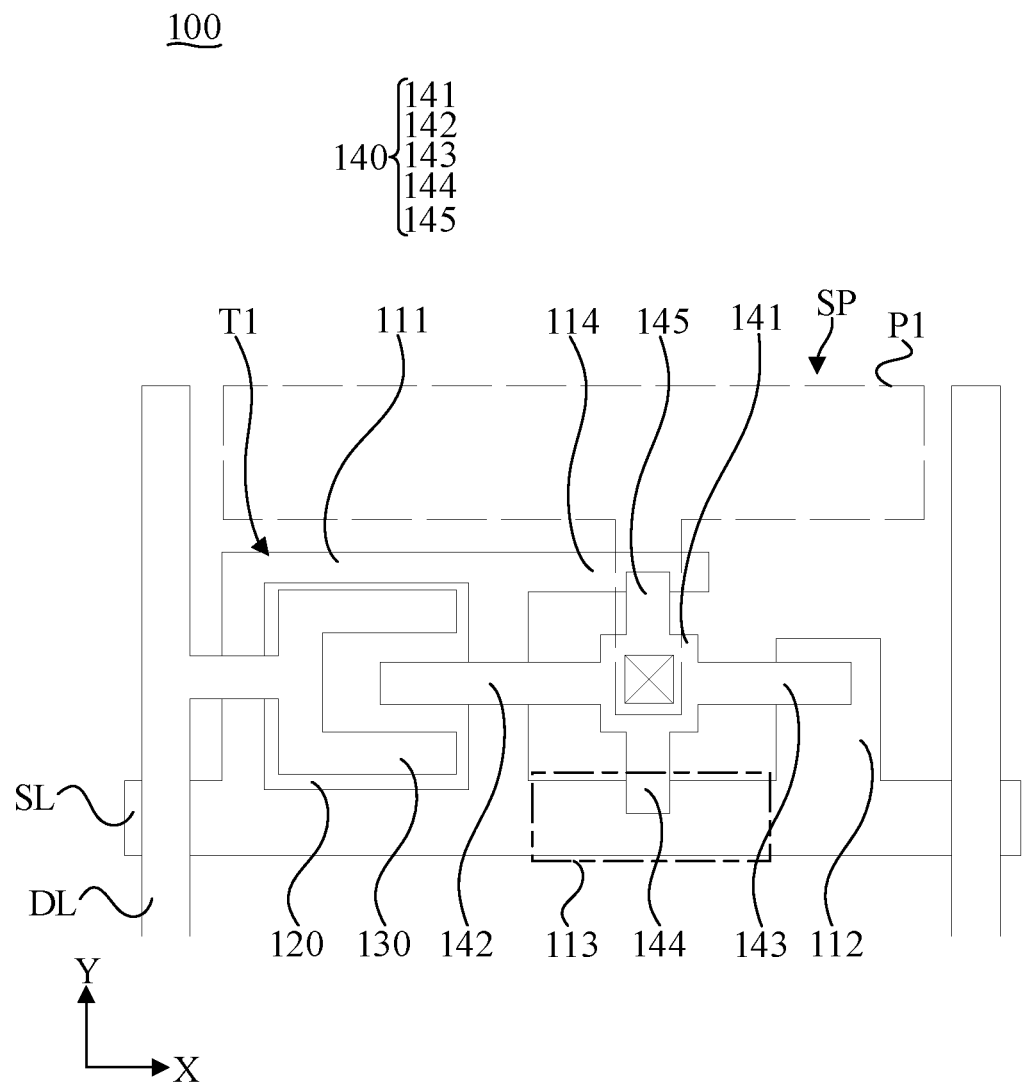
FIG. 4 is a schematic structural view of a third type of array substrate in an embodiment of the present application.

Specifically, as shown in FIG. 4, the special-shaped thin-film transistor T1 further includes a second compensation electrode 113. The second compensation electrode 113 and the first source electrode 140 are disposed in different layers, and the second compensation electrode 113 is connected to the first source electrode 140. Specifically, the second compensation electrode 113 is connected to the gate line SL, and is connected to the first gate portion 111 through the gate line SL.

The special-shaped thin-film transistor T1 further includes a third compensation electrode 114. The third compensation electrode 114 and the first source electrode 140 are disposed in different layers. The third compensation electrode 114 is connected to the first gate portion 111 and is disposed on a side of the second compensation electrode 113 in the second direction Y. The first source portion 141 is disposed between the second compensation electrode 113 and the third compensation electrode 114.

The first source electrode 140 further includes a third extension part 144 and a fourth extension part 145. The third extension part 144 is connected to the first source portion 141, and part of the third extension part 144 overlaps the second compensation electrode 113. The fourth extension part 145 is connected to the first source portion 141 and is disposed to partially overlap the third compensation electrode 114. In this embodiment, the third extension part 144 is connected to a side of the first source portion 141 close to the second compensation electrode 113, and the fourth extension part 145 is connected to a side of the first source portion 141 close to the third compensation electrode 114.

In the array substrate 100 of the embodiment of the present application, by disposing the second compensation electrode 113 on a side of the first source portion 141 close to the gate line SL, and by disposing the third compensation electrode 114 on a side of the first source portion 141 away from the gate line SL, the first source portion 141 is arranged between the second compensation electrode 113 and the third compensation electrode 114. The first source plart 141 extends toward the second compensation electrode 113 to form the third extension part 144, and the part of the third extension part 144 overlaps the second compensation electrode 113; the first source portion 141 extends toward the third compensation electrode 114 to form the fourth extension part 144, and the part of the fourth extension part 145 overlaps the third compensation electrode 114. With this structure, a sum of the capacitance the between the first extension part 142 and the first gate portion 111, the capacitance between the second extension part 143 and the first compensation electrode 112, the capacitance between the third extension part 144 and the second compensation electrode 113, and the capacitance between the fourth extension part 145 and the third compensation electrode 114 is the parasitic capacitance of the special-shaped thin-film transistor T1.

When the first source electrode 140 is shifted upward due to the manufacturing process, an overlapping area of the third extension part 144 and the second compensation electrode 113 will increase, and the capacitance between the third extension part 144 and the second compensation electrode 113 will increase. In addition, an overlapping area of the fourth extension part 145 and the third compensation electrode 114 will decrease, the capacitance between the fourth extension 145 and the third compensation electrode 114 will be reduced, so that a capacitance change value between the third extension part 144 and the second compensation electrodes 113 is equal to a capacitance change value between the fourth extension part 145 and the third compensation electrode 114, thus making the parasitic capacitance of the special-shaped thin-film transistor T1 unchanged. Likewise, when the first source electrode 140 is shifted downward due to the manufacturing process, the parasitic capacitance of the special-shaped thin-film transistor T1 also remains unchanged. Therefore, the technical solution of the present application can solve the technical problem of increased parasitic capacitance due to process deviation.

Specifically, as shown in FIG. 4, the third extension part 144 and the fourth extension part 145 are both strip-like in shape, wherein an extending direction of the third extension part 144 and an extending direction of the fourth extension part 145 are both parallel to the second direction Y, and the extending direction of the third extension part 144 is opposite to the extending direction of the fourth extending portion 145. With this structure, the first source electrode 140 is easy to be fabricated due to its simple shape, and the process difficulty of the special-shaped thin-film transistor T1 will not be increased.

Specifically, as shown in FIG. 4, in the first direction X, a width of the third extension part 144 is equal to a width of the fourth extension part 145. With this structure, even if the first source electrode 140 is shifted up and down due to the process variation, it can be ensured that a change value of the overlapping area of the third extension part 144 and the second compensation electrode 113 is equal to a change value of the overlapping area of the fourth extension part 145 and the third compensation electrode 114, so that the parasitic capacitance of the special-shaped thin-film transistor T1 remains unchanged.

Specifically, as shown in FIG. 4, in the second direction Y, the third extension part 144 and the fourth extension part 145 completely overlap, that is, the third extension part 144 is located on the extension line of the fourth extension part 145. With this structure, the occupied space of the first source electrode 140 can be reduced, which is beneficial to achieve the miniaturization of the special-shaped thin-film transistor T1. Certainly, according to actual selection and specific requirements, in the second direction Y, the third extension part 144 and the fourth extension part 145 may also partially overlap or be staggered from each other, which is not limited herein.

Figure 5:
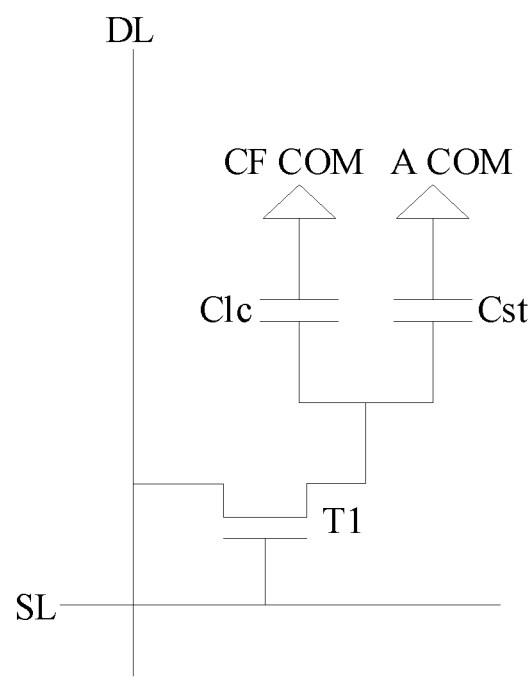
FIG. 5 is a schematic diagram of an equivalent circuit principle of the first, second, and third types of array substrates.

FIG. 5 is a schematic diagram showing an equivalent circuit principle of the array substrate 100 in accordance with the embodiments shown in FIGS. 2 to 4. When the above-mentioned array substrate 100 is applied to a display panel 10, the data signal is transmitted from the data line DL to the special-shaped thin-film transistor T1. When a switching signal is transmitted from the gate line SL to the first gate portion 111 of the special-shaped thin-film transistor T1, the data signal is transmitted from the first drain electrode 130 to the first source electrode 140, and the first source electrode 140 then transmits the data signal to the first pixel electrode P1. When the first pixel electrode P1 has a voltage difference with a common electrode, it can drive the liquid crystal to deflect, thereby displaying image. The array substrate 100 of the embodiments shown in FIG. 2 to FIG. 4 can be, but is not limited to, applied to the array substrate 100 of the four-domain pixel design.

Specifically, FIGS. 6 to 9 are schematic structural views of the fourth to seventh type of array substrates 100 provided by the embodiments of the present application. The structures of the array substrates 100 shown in FIGS. 6 to 9 are the same as those shown in FIGS. 2 to 4. A main difference in the structure of the array substrate 100 is that the array substrate 100 is provided with a subpixel region SP, and the subpixel region SP includes a first region sp1 and a second region sp2. The array substrate 100 further includes a second pixel electrode P2. The first pixel electrode P1 is disposed corresponding to the first region sp1, the first source electrode 140 is connected to the first pixel electrode P1, and the second pixel electrode P2 is disposed corresponding to the second region sp2. The array substrate 100 further includes a sub-thin film transistor T2 electrically connected to the second pixel electrode P2. With this structure, a voltage for driving the first pixel electrode P1 is independently controlled by the special-shaped thin-film transistor T1, and the second pixel electrode is independently controlled and driven by the sub-thin film transistor T2. In this manner, the voltages of the first pixel electrode P1 and the second pixel electrode P2 are different, which is beneficial to achieve multi-domain display.

Figure 6:
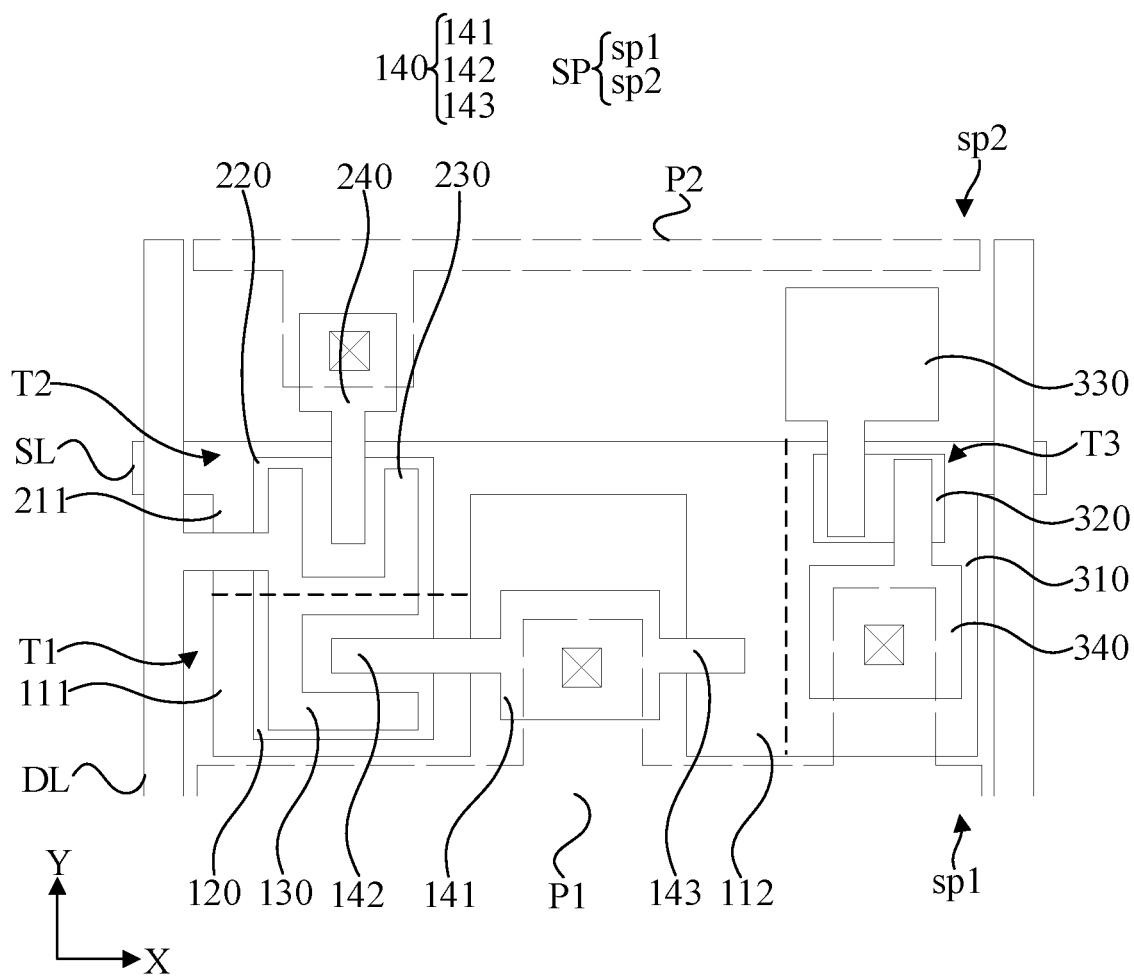
FIG. 6 is a schematic structural view of a fourth type of array substrate in an embodiment of the present application.
Figure 7:
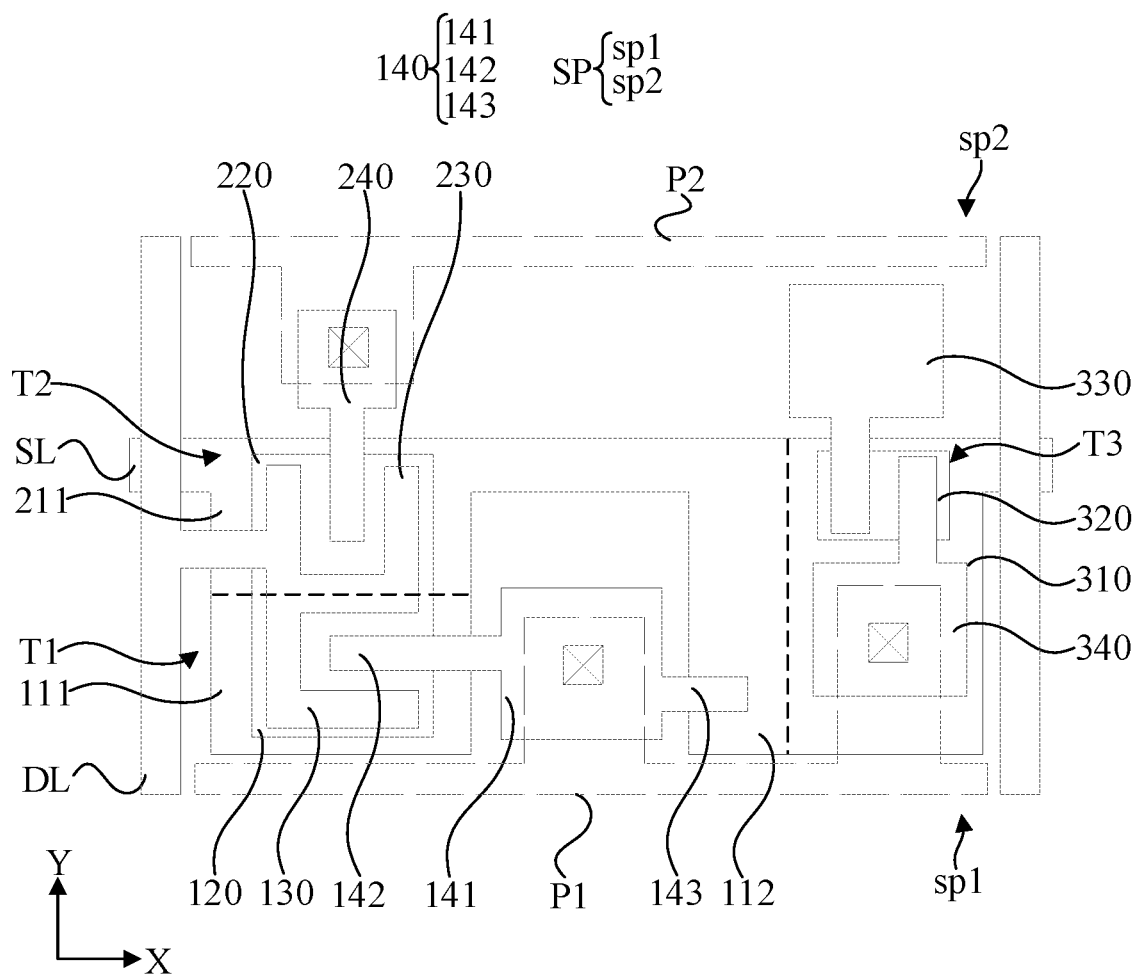
FIG. 7 is a schematic structural view of a fifth type of array substrate in an embodiment of the present application.
Figure 8:
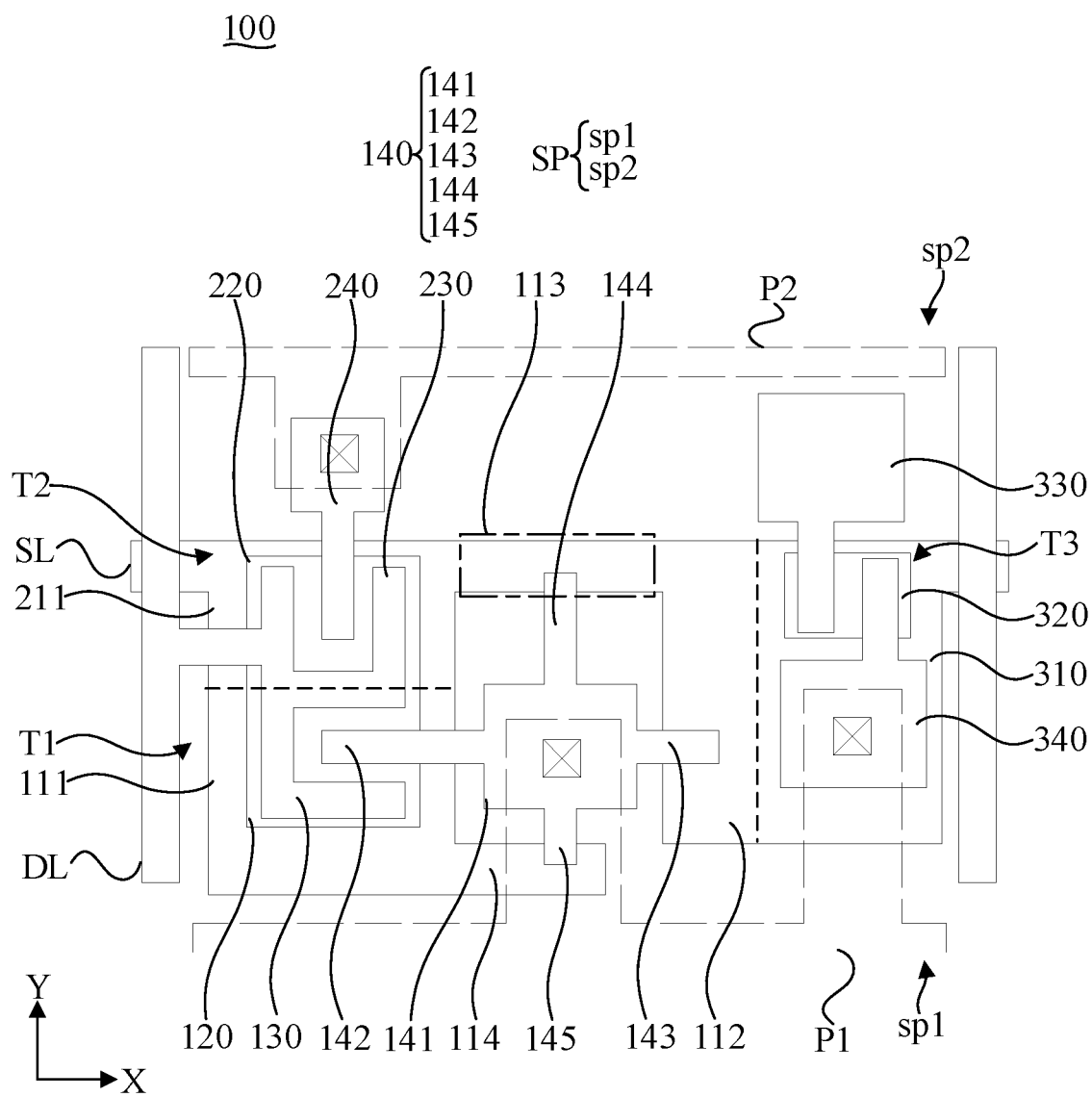
FIG. 8 is a schematic structural view of a sixth type of array substrate in an embodiment of the present application.

Specifically, as shown in FIGS. 6 to 8, the sub-thin film transistor T2 includes a second gate portion 211 and a second source electrode 240. The second gate portion 211 and the first gate portion 111 are arranged in a same layer, and the second source electrode 240 is disposed in a same layer as the first source electrode 140. Part of the second source electrode 240 and the second gate portion 211 overlap. Parasitic capacitance of the second region sp2 (i.e., parasitic capacitance of sub-thin film transistor T2) is capacitance between the second gate portion 211 and the second source electrode 240. Parasitic capacitance of the first region sp1 (i.e., parasitic capacitance of the special-shaped thin-film transistor T1) is equal to the capacitance between the first extension part 142 and the first gate portion 111 plus the capacitance between the second extension part 143 and the first compensation electrode 112. It can be seen that, compared with the parasitic capacitance of the second region sp2, the parasitic capacitance of the first region sp1 further includes the capacitance between the second extension part 143 and the first compensation electrode 112. The capacitance as further included between the second extension part 143 and the first compensation electrode 112 can play a compensation role to make up for a capacitance difference between the parasitic capacitance of the first region sp1 and the parasitic capacitance of the second region sp2, thereby solving a problem of screen flickers and afterimage.

Figure 9:
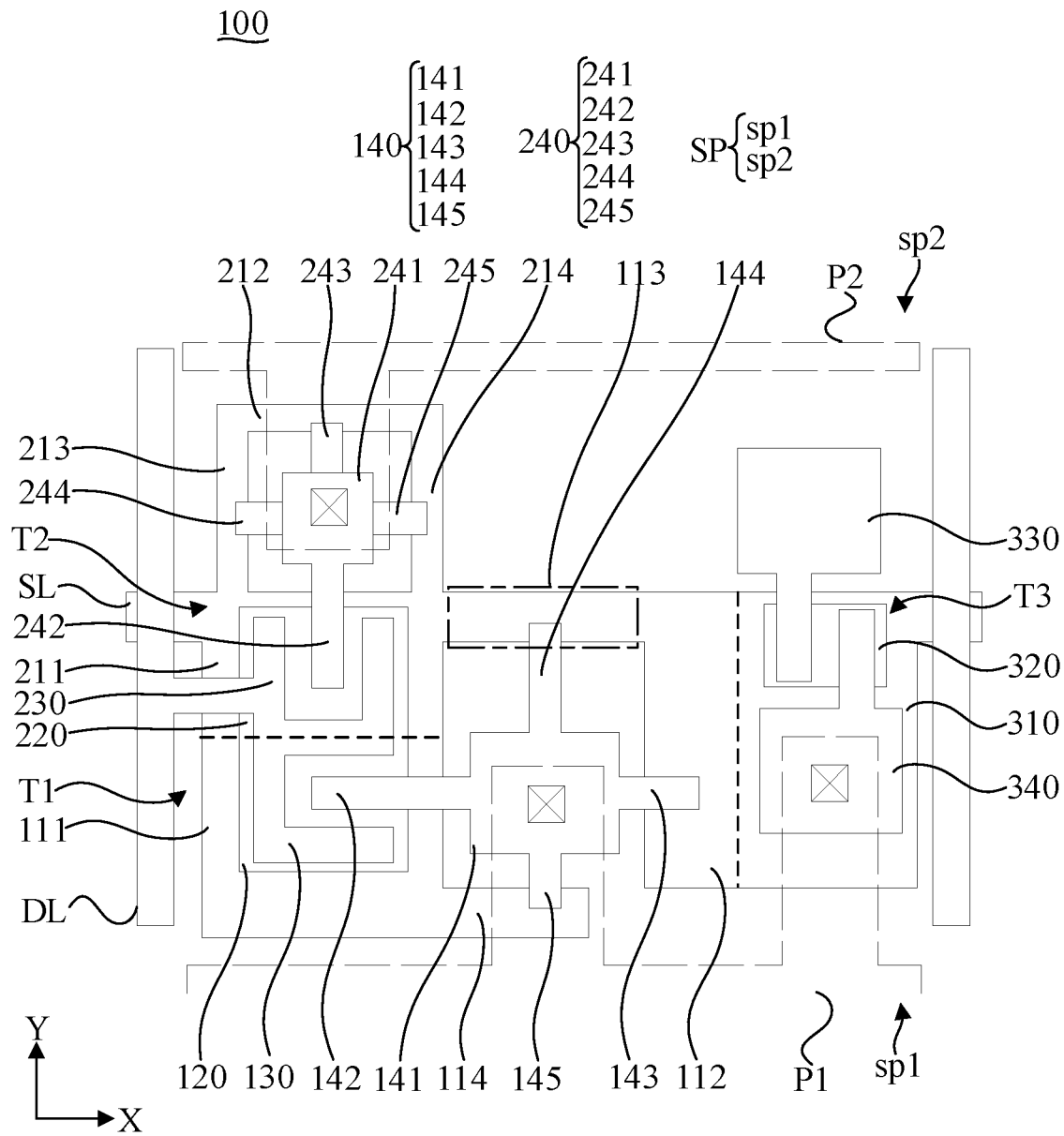
FIG. 9 is a schematic structural view of a seventh type of array substrate in an embodiment of the present application.

Specifically, as shown in FIG. 9, the array substrate 100 includes two special-shaped thin-film transistors, a first special-shaped thin-film transistor and a second special-shaped thin-film transistor. The first special-shaped thin-film transistor and the second special-shaped thin-film transistor are electrically connected to the first pixel electrode and the second pixel electrode, respectively. For the convenience of description, the first special-shaped thin-film transistor is referred to as the special-shaped thin-film transistor T1, and the second special-shaped thin-film transistor is referred to as the sub-thin-film transistor T2. The sub-thin film transistor T2 includes the second gate portion 211 and a fourth compensation electrode 212. The second gate portion 211 is connected to the gate line SL, and the fourth compensation electrode 212 is located on one side of the second gate portion 211 and is connected to the second gate portion 211, that is, the fourth compensation electrode 212 is electrically connected to the second gate portion 211. In this embodiment, the first gate portion 111 is connected to the second gate portion 211, and the first gate portion 111 is connected to the gate line SL through the second gate portion 211, that is, the first gate portion 111 and the second gate portion 211 are integrally connected as an integrated structure. There is no gap between the first gate portion 111 and the second gate portion 211, so that the structure of the special-shaped thin-film transistor T1 and the sub-thin film transistor T2 can be constructed more compactly, which is conducive to miniaturization.

In this embodiment of the present application, the second gate portion 211 may be, but not limited to, provided in the same layer as the first gate portion 111. The second gate portion 211 and the fourth compensation electrode 212 may be spaced apart from each other, a gap is formed between the second gate portion 211 and the fourth compensation electrode 212, and the second gate portion 211 and the fourth compensation electrode 212 are located in a same layer structure. Certainly, the second gate portion 211 and the fourth compensation electrode 212 may be located in different layers according to actual selection and specific requirements, as long as it is ensured that the second gate portion 211 and the fourth compensation electrode 212 are connected, and the gap is formed between the second gate portion 211 and the fourth compensation electrode 212 in a direction parallel to the array substrate 100, which is not limited herein.

Specifically, the array substrate 100 further includes a second source electrode 240, the second source electrode 240 and the second gate portion 211 are disposed in different layers. The second source electrode 240 and the fourth compensation electrode 212 are disposed in different layers, and the second source electrode 240 includes a fifth extension part 242, a second source portion 241, and a sixth extension part 243. The fifth extension part 242 is connected to the second source portion 241, the sixth extension part 243 is connected to the second source portion 241, and the second source portion 241 is located between the second gate portion 211 and the fourth compensation electrode 212. The fifth extension part 242 is partially overlapped with the second gate portion 211. The sixth extension part 243 is partially overlapped with the fourth compensation electrode 212. In this embodiment, the second source electrode 240 and the first source electrode 140 are disposed in a same layer, and the second source electrode 240 is connected to the second pixel electrode P2. In this embodiment, the fifth extension part 242 is disposed on a side of the second source portion 241 close to the second gate portion 211, and the sixth extension part 243 is disposed on a side of the second source portion 241 close to the fourth compensation electrode 212.

In the array substrate 100 of the embodiment of the present application, the fourth compensation electrode 212 is disposed on a side of the second gate portion 211 and is connected to the second gate portion 211, and the second source portion 241 is disposed between the second gate portion 211 and the fourth compensation electrode 212. The second source portion 241 extends toward the second gate portion 211 to form the fifth extension portion 242, and the part of the fifth extension part 242 is disposed overlapping with the second gate portion 211. The second source portion 241 extends toward the fourth compensation electrode 212 to form the sixth extension part 243, and the part of the sixth extension part 243 overlaps the fourth compensation electrode 212. With this structure, the parasitic capacitance of the sub-thin film transistor T2 is equal to capacitance between the fifth extension part 242 and the second gate portion 211 plus capacitance between the sixth extension part 243 and the fourth compensation electrode 212.

When the second source electrode 240 is shifted downward due to the manufacturing process, an overlapping area of the fifth extension part 242 and the second gate portion 211 increases, and the capacitance between the fifth extension part 242 and the second gate portion 211 increases. Accordingly, an overlapping area of the sixth extension part 243 and the fourth compensation electrode 212 decreases, and the capacitance between the sixth extension part 243 and the fourth compensation electrode 212 is reduced, so that a capacitance change value between the fifth extension part 242 and the second gate portion 211 is equal to a capacitance change value between the sixth extension part 243 and the fourth compensation electrode 212, making the parasitic capacitance of the sub-thin film transistor T2 unchanged. Likewise, when the second source electrode 240 is shifted upward due to the manufacturing process, the parasitic capacitance of the sub-thin film transistor T2 also remains unchanged. Therefore, the technical solution of the present application can solve the technical problem of increased parasitic capacitance due to process deviation.

Specifically, the sub-thin film transistor T2 further includes a second active layer 220 and a second drain electrode 230. The second active layer 220 and the second gate portion 211 are disposed in different layers, and the second active layer 220 and the second gate portion 211 are disposed at least partially overlapping. The second drain electrode 230 and the second gate portion 211 are disposed in different layers, the second drain electrode 230 is also disposed in a different layer from the fourth compensation electrode 212, and the second drain electrode 230 and the second source electrode 240 are connected to the second active layer 220, respectively. In this embodiment, the first active layer 120 is connected to the second active layer 220, that is, the first active layer 120 and the second active layer 220 are integrally connected in an integrated structure. There is no gap between the first active layer 120 and the second active layer 220, so that the special-shaped thin-film transistor T1 and the sub-thin film transistor T2 can be constructed more compactly, which is conducive to miniaturization.

In the embodiment of the present application, the second active layer 220 is disposed in the same layer as the first active layer 120 and is disposed above the second gate portion 211, and the second source electrode 240 and the second drain electrode 230 are disposed in a same layer and disposed on the second active layer 220. Certainly, according to actual selection and specific requirements, a stacking sequence of the second gate portion 211, the second active layer 220, the second source electrode 240, and the second drain electrode 230 can be appropriately modified, which is not limited herein.

Specifically, the fourth compensation electrode 212 is disposed on a side of the second gate portion 211 in the second direction Y. With this structure, the space of the array substrate 100 can be reasonably allocated, which is beneficial to the realization of the miniaturization of the sub-thin film transistor T2.

Specifically, the fifth extension part 242 and the sixth extension part 243 are both strip-line in shape, wherein an extending direction of the fifth extension part 242 and an extending direction of the sixth extension part 243 are both parallel to the second direction Y, and the extending direction of the fifth extension part 242 is opposite to that of the sixth extension part 243. With this structure, the second source electrode 240 is easy to be fabricated due to its simple shape, and the process difficulty of the sub-thin film transistor T2 will not be increased.

Specifically, in the first direction X, a width of the fifth extension part 242 is equal to a width of the sixth extension part 243. Under this structure, even if the second source electrode 240 is shifted up and down due to process variation, it can be ensured that a change value of the overlapping area of the fifth extension part 242 and the second gate portion 211 is equal to a change value of the overlapping area of the sixth extension part 243 and the fourth compensation electrode 212, so that the parasitic capacitance of the sub-thin film transistor T2 remains unchanged.

Specifically, as shown in FIG. 6, in the second direction Y, the fifth extension part 242 and the sixth extension part 243 completely overlap, that is, the fifth extension part 242 is located on an extension line of the sixth extension part 243. With this structure, the space occupied by the second source electrode 240 can be reduced, which is beneficial to the miniaturization of the sub-thin film transistor T2. Certainly, according to actual selection and specific requirements, in the second direction Y, the fifth extension part 242 and the sixth extension part 243 may also partially overlap, which is not limited herein.

In another embodiment of the present application, as shown in FIG. 7, in the second direction Y, the fifth extension part 242 and the sixth extension part 243 are staggered from each other, that is, the fifth extension part 242 is arranged to avoid the extension line of the sixth extension part 243. With this structure, the second source electrode 240 can be increased in size, thereby reducing contact resistance of the second source electrode 240, reducing energy loss, and improving the performance of the sub-thin film transistor T2.

Specifically, as shown in FIG. 9, the sub-thin film transistor T2 further includes a fifth compensation electrode 213 and a sixth compensation electrode 214. The fifth compensation electrode 213 and the second source electrode 240 are disposed in different layers, and the second gate portion 211 is connected to the fifth compensation electrode 213, that is, the second gate portion 211 is electrically connected to the fifth compensation electrode 213. The sixth compensation electrode 214 and the second source electrode 240 are disposed in different layers, and the second gate portion 211 is connected to the sixth compensation electrode 214, that is, the second gate portion 211 is electrically connected to the sixth compensation electrode 214. The sixth compensation electrode 214 is disposed on one side of the fifth compensation electrode 213 in the first direction X, and the second source portion 241 is disposed between the fifth compensation electrode 213 and the sixth compensation electrode 214. In this embodiment, the fourth compensation electrode 212 is connected to the second gate portion 211 through the fifth compensation electrode 213 and the sixth compensation electrode 214.

The second source electrode 240 further includes a seventh extension part 244 and an eighth extension part 245. The seventh extension part 244 is connected to the second source portion 241, and part of the seventh extension part 244 overlaps the fifth compensation electrode 213. The eighth extension part 245 is connected to the second source portion 241, and part of the eighth extension part 245 overlaps the sixth compensation electrode 214. In this embodiment, the seventh extension part 244 is connected to a side of the second source portion 241 close to the fifth compensation electrode 213, and the eighth extension part 245 is connected to a side of the second source portion 241 close to the sixth compensation electrode 214.

In the array substrate 100 of the embodiment of the present application, by disposing the fifth compensation electrode 213 on the side of the second source portion 241 in the first direction X and by disposing the six compensation electrode 214 on the side of the second source portion 241 away from the fifth compensation electrode 213, the second source portion 241 is located between the fifth compensation electrode 213 and the sixth compensation electrode 214. The second source portion 241 extends toward the fifth compensation electrode 213 to form the seventh extension part 244, and the part of the seventh extension part 244 overlaps the fifth compensation electrode 213. The second source portion 241 extends toward the sixth compensation electrode 214 to form the eighth extension part 245, and the part of the eighth extension part 245 overlaps the sixth compensation electrode 214. With this structure, a sum of the capacitance between the part of the fifth extension part 242 and the second gate portion 211, the capacitance between the sixth extension part 243 and the fourth compensation electrode 212, the capacitance between the seventh extension part 244 and the fifth compensation electrode 213, and the capacitance between the eighth extension part 245 and the sixth compensation electrode 214 is the parasitic capacitance of the sub-thin-film transistor T2.

When the first source electrode 140 is shifted upward due to the manufacturing process, an overlapping area of the third extension part 144 and the second compensation electrode 113 will increase, and the capacitance between the third extension part 144 and the second compensation electrode 113 will increase. In addition, an overlapping area of the fourth extension part 145 and the third compensation electrode 114 will decrease, the capacitance between the fourth extension 145 and the third compensation electrode 114 will be reduced, so that a capacitance change value between the third extension part 144 and the second compensation electrodes 113 is equal to a capacitance change value between the fourth extension part 145 and the third compensation electrode 114, thus making the parasitic capacitance of the special-shaped thin-film transistor T1 unchanged. Likewise, when the second source electrode 240 is shifted to the right due to the manufacturing process, the parasitic capacitance of the sub-thin film transistor T2 also remains unchanged. Therefore, the technical solution of the present application can solve the technical problem of increased parasitic capacitance due to process deviation.

Specifically, as shown in FIG. 9, the seventh extension part 244 and the eighth extension part 245 are both strip-like in shape, wherein an extending direction of the seventh extension part 244 and an extending direction of the eighth extension part 245 are both parallel to the first direction X, and the extending direction of the seventh extension part 244 is opposite to the extending direction of the eighth extension part 245. With this structure, the second source electrode 240 is easy to be fabricated due to its simple shape, and the process difficulty of the sub-thin film transistor T2 will not be increased.

Specifically, as shown in FIG. 9, in the second direction Y, a width of the seventh extension part 244 is equal to a width of the eighth extension part 245. With this structure, even if the second source electrode 240 is shifted left and right due to the process variation, it can be ensured that a change value of the overlapping area of the seventh extension part 244 and the fifth compensation electrode 213 is equal to a change value of the overlapping area of the eighth extension part 245 and the sixth compensation electrode 214, so that the parasitic capacitance of the sub-thin film transistor T2 remains unchanged.

Specifically, as shown in FIG. 9, in the first direction X, the seventh extension part 244 and the eighth extension part 245 completely overlap, that is, the seventh extension part 244 is located on the extension line of the eighth extension part 245. With this structure, the space occupied by the second source electrode 240 can be reduced, which is beneficial to the miniaturization of the sub-thin film transistor T2. Certainly, according to actual selection and specific requirements, in the first direction X, the seventh extension part 244 and the eighth extension part 245 may also partially overlap or be staggered from each other, which is not limited herein.

It can be understood that the sub-thin film transistor T2 in the embodiment of the present application is the second special-shaped thin-film transistor, and the second gate portion 211, the fourth compensation electrode 212, the fifth compensation electrode 213, the sixth compensation electrode 214, the fifth extension part 242, the second source portion 241, the sixth extension part 243, the seventh extension part 244, and the eighth extension part 245 of the sub-thin film transistor T2 are the first gate portion, the first compensation electrode, the second compensation electrode, the third compensation electrode, the first extension part, the first source portion, the second extension part, the third extension part, and the fourth extension part of the second special-shaped thin-film transistor, respectively. The first gate portion of the first special-shaped thin-film transistor is connected to the gate line through the first gate portion of the second special-shaped thin-film transistor. The extending direction of the first extension part of the first special-shaped thin-film transistor intersects with the extending direction of the first extension part of the second special-shaped thin-film transistor.

Specifically, as shown in FIGS. 6 to 9, the array substrate 100 further includes a shared thin-film transistor T3, and the shared thin-film transistor T3 includes a third gate portion 310 and a third active layer 320, a third drain electrode 330, and a third source electrode 340. The third gate portion 310 is connected to the gate line SL, the third active layer 320 is disposed above the third gate portion 310, the third drain electrode 330 and the third source electrode 340 are disposed above the third active layer 320, and the third drain electrode 330 and the third source electrode 340 are connected to the third active layer 320, respectively. In this embodiment, the third source electrode 340 is connected to the second pixel electrode P2. In this embodiment, the third gate portion 310 is connected to the first compensation electrode 112, that is, the third gate portion 310 and the first compensation electrode 112 are integrally connected as an integrated structure. There is no space between the third gate portion 310 and the first compensation electrode 112, so that the structure of the special-shaped thin-film transistor T1 and the shared thin-film transistor T3 can be constructed more compactly, which is conducive to miniaturization.

Figure 10:
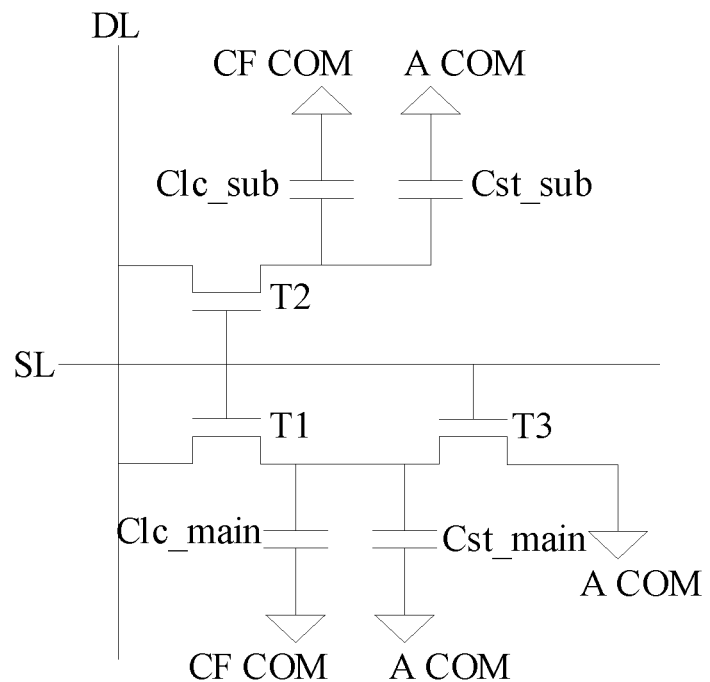
FIG. 10 is a schematic diagram of an equivalent circuit principle of the fourth, fifth, sixth, and seventh types of array substrates.

FIG. 10 is a schematic diagram showing an equivalent circuit principle of the array substrate 100 in accordance with the embodiments shown in FIGS. 6 to 9. When the above-mentioned array substrate 100 is applied to the display panel 10, the data signal is transmitted from the data line DL to the first drain electrode 130 of the special-shaped thin-film transistor T1. When a switching signal is transmitted from the gate line SL to the first gate portion 111 of the special-shaped thin-film transistor T1, the data signal is transmitted from the first drain electrode 130 to the first source electrode 140, and the first source electrode 140 then transmits the data signal to the first pixel electrode P1. When the first pixel electrode P1 has a voltage difference with a corresponding common electrode, the liquid crystal of the first region sp1 is driven to deflect.

The data signal is transmitted from the data line DL to the second drain electrode 230 of the sub-thin film transistor T2. When the switching signal is transmitted from the gate line SL to the second gate portion 211 of the sub-thin film transistor T2, the data signal is transmitted from the second drain electrode 230 to the second source electrode 240, and the second source electrode 240 then transmits the data signal to the second pixel electrode P2. At the same time, when the switching signal of the shared thin film transistor is transmitted from the gate line SL to the third gate portion 310 of the shared thin-film transistor T3, the second source electrode 240 distributes a part of the data signal to the shared thin-film transistor T3, and the shared thin-film transistor T3 can act as a voltage divider, thereby reducing the voltage received by the second pixel electrode P2, so that the voltages of the first pixel electrode P1 and the second pixel electrode P2 are different, thus enabling multi-domain display.

It can be seen that the voltage received by the first pixel electrode P1 is different from the voltage received by the second pixel electrode P2, which is beneficial to multi-domain display. The array substrate 100 of the above embodiments shown in FIGS. 6 to 9 can be applied to, but not limited to, an array substrate 100 with an eight-domain pixel design.

Figure 11:
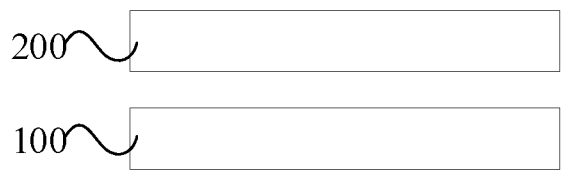
FIG. 11 is a schematic structural view of a display panel in an embodiment of the present application.

Referring to FIG. 11, an embodiment of the present application further provides a display panel 10, which includes an opposite substrate 200 and the array substrate 100 as described above. The opposite substrate 200 is disposed opposite to the array substrate 100.

Figure 12:
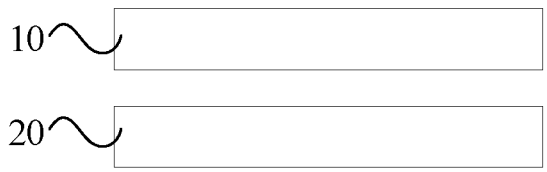
FIG. 12 is a schematic structural view of a display device in an embodiment of the present application.

Referring to FIG. 12, an embodiment of the present application further provides a display device including a backlight module 20 and the above-mentioned display panel 10. The backlight module 20 is disposed on a side of the display panel 10.

The special-shaped thin-film transistor and the array substrate provided by the embodiments of the present application are described in detail above. Specific examples are used in this article to illustrate the principles and implementation of the application, and the descriptions of the above examples are only used to help understand the methods and core ideas of the application; in addition, for those skilled in the art, according to the idea of the application, there will be changes in the specific implementation and the scope of application. In summary, the content of this specification should not be construed as a limitation of the application.

What is claimed is:

1. A special-shaped thin-film transistor, comprising:
a first gate portion;
a first compensation electrode located on one side of the first gate portion and connected to the first gate portion; and
a first source electrode disposed in a layer different from the first gate portion and the first compensation electrode, and the first source electrode comprising a first extension part, a first source portion, and a second extension part, wherein the first extension part is connected to the first source portion, the second extension part is connected to the first source portion, part of the first extension part overlaps the first gate portion, and part of the second extension part overlaps the first compensation electrode;
wherein an extending direction of the first extension part and an extending direction of the second extension part are parallel, and the extending direction of the first extension part is opposite to the extending direction of the second extension part;
wherein the special-shaped thin-film transistor further comprises:
a second compensation electrode disposed in a layer different from the first source electrode and connected to the first gate portion; and
a third compensation electrode disposed in a layer different from the first source electrode and connected to the first gate portion, wherein the third compensation electrode is arranged on a side of the second compensation electrode in a direction perpendicular to the extending direction of the first extension part or the second extension part, and the first source portion is arranged between the second compensation electrode and the third compensation electrode;
wherein the first source electrode further comprises a third extension part and a fourth extension part, the third extension part is connected to the first source portion, part of the third extension part overlaps the second compensation electrode, the fourth extension part is connected to the first source portion, and part of the fourth extension part overlaps the third compensation electrode.

2. The special-shaped thin-film transistor of claim 1, wherein in a direction perpendicular to the extending direction of the first extension part or the second extension part, a width of the first extension part is same as a width of the second extension part.

3. The special-shaped thin-film transistor of claim 1, wherein in the extending direction of the first extension part or the second extension part, the first extension part and the second extension part are at least partially overlapping or staggered.

4. The special-shaped thin-film transistor of claim 1, wherein an extending direction of the third extension part and an extending direction of the fourth extension part are parallel, the extending direction of the third extension part is opposite to the extending direction of the fourth extension part, and the extending direction of the third extension part intersects with the extending direction of the first extension part.

5. The special-shaped thin-film transistor of claim 4, wherein in a direction perpendicular to the extending direction of the third extension part or the fourth extension part, a width of the third extension part is same as a width of the fourth extension part.

6. The special-shaped thin-film transistor of claim 4, wherein in the extending direction of the third extension part or the fourth extension part, the third extension part and the fourth extension part are at least partially overlapping or staggered.

7. The special-shaped thin-film transistor of claim 1, wherein the first extension part is disposed between the first compensation electrode and a side of the first gate portion away from the first compensation electrode, and the second extension part is disposed between the first gate portion and a side of the first compensation electrode away from the first gate portion.

8. An array substrate, comprising the special-shaped thin-film transistor of claim 1, and a gate line and a data line, wherein the first gate portion and the first compensation electrode are arranged on a same side of the gate line, the first compensation electrode is arranged on a side of the first gate portion in an extending direction of the gate line, the first compensation electrode is connected to the first gate portion through the gate line, and the data line is connected to the first source electrode;
wherein an extending direction of the first extension part and an extending direction of the second extension part are parallel, and the extending direction of the first extension part is opposite to the extending direction of the second extension part;
wherein the special-shaped thin-film transistor further comprises:
a second compensation electrode disposed in a layer different from the first source electrode and connected to the first gate portion; and
a third compensation electrode disposed in a layer different from the first source electrode and connected to the first gate portion, wherein the third compensation electrode is arranged on a side of the second compensation electrode in a direction perpendicular to the extending direction of the first extension part or the second extension part, and the first source portion is arranged between the second compensation electrode and the third compensation electrode;

wherein the first source electrode further comprises a third extension part and a fourth extension part, the third extension part is connected to the first source portion, part of the third extension part overlaps the second compensation electrode, the fourth extension part is connected to the first source portion, and part of the fourth extension part overlaps the third compensation electrode.

9. The array substrate of claim 8, wherein in a direction perpendicular to the extending direction of the first extension part or the second extension part, a width of the first extension part is same as a width of the second extension part.

10. The array substrate of claim 8, wherein in the extending direction of the first extension part or the second extension part, the first extension part and the second extension part are at least partially overlapping or staggered.

11. The array substrate of claim 8, wherein an extending direction of the third extension part and an extending direction of the fourth extension part are parallel, the extending direction of the third extension part is opposite to the extending direction of the fourth extension part, and the extending direction of the third extension part intersects with the extending direction of the first extension part.

12. The array substrate of claim 11, wherein in a direction perpendicular to the extending direction of the third extension part or the fourth extension part, a width of the third extension part is same as a width of the fourth extension part.

13. The array substrate of claim 11, wherein in the extending direction of the third extension part or the fourth extension part, the third extension part and the fourth extension part are at least partially overlapping or staggered.

14. The array substrate of claim 8, wherein the first extension part is disposed between the first compensation electrode and a side of the first gate portion away from the first compensation electrode, and the second extension part is disposed between the first gate portion and a side of the first compensation electrode away from the first gate portion.

15. The array substrate of claim 8, further comprising a subpixel region comprising a first region and a second region; and a first pixel electrode and a second pixel electrode, wherein the first pixel electrode is arranged corresponding to the first region, and the second pixel electrode is arranged corresponding to the second region;

wherein the array substrate comprises two special-shaped thin-film transistors including a first special-shaped thin-film transistor and a second special-shaped thin-film transistor, a first source of the first special-shaped thin-film transistor and a second source of the second special-shaped thin-film transistors are electrically connected to the first pixel electrode and the second pixel electrode, respectively.

16. The array substrate of claim 15, wherein a first gate portion of the first special-shaped thin-film transistor is connected to the gate line through a first gate portion of the second special-shaped thin-film transistor, and an extending direction of a first extension part included in the first special-shaped thin-film transistor intersects with an extending direction of a first extension part included in the second special-shaped thin-film transistor.

* * * * *